United States Patent [19]
Pace et al.

[11] Patent Number: 5,585,749
[45] Date of Patent: Dec. 17, 1996

[54] HIGH CURRENT DRIVER PROVIDING BATTERY OVERLOAD PROTECTION

[75] Inventors: Gary L. Pace; David H. Overton, both of Boca Raton, Fla.

[73] Assignee: Motorola, Inc., Schaumburg, Ill.

[21] Appl. No.: 363,785

[22] Filed: Dec. 27, 1994

[51] Int. Cl.⁶ ............... G11C 8/00; H03K 17/60; G06G 7/12; G08B 5/22
[52] U.S. Cl. ............ 327/108; 327/484; 327/490; 327/563; 327/576; 340/825.44
[58] Field of Search ................ 327/108, 109, 327/110, 111, 530, 533, 535, 538, 539, 540, 541, 560, 561, 563, 483, 484, 489, 490, 575, 576; 323/312, 313, 314, 315, 316, 317, 271, 289; 340/825.44; 455/343

[56] References Cited

U.S. PATENT DOCUMENTS

| | | | |
|---|---|---|---|
| 3,810,006 | 5/1974 | Vittoz | 327/484 |
| 4,107,596 | 8/1978 | Weaver et al. | 323/271 |
| 4,221,979 | 9/1980 | Ahmed | 327/484 |
| 4,396,889 | 8/1983 | Arai | 327/484 |
| 4,631,737 | 12/1986 | Davis et al. | 455/343 |
| 4,847,520 | 7/1989 | O'Neill et al. | 327/484 |
| 5,128,553 | 7/1992 | Nelson | 327/484 |
| 5,357,188 | 10/1994 | Takeda et al. | 323/315 |
| 5,412,336 | 5/1995 | Barrett, Jr. et al. | 327/560 |
| 5,430,439 | 7/1995 | Bodet et al. | 340/825.44 |

*Primary Examiner*—David C. Nelms
*Assistant Examiner*—Trong Phan
*Attorney, Agent, or Firm*—Philip P. Macnak

[57] ABSTRACT

A high current driver (100) for driving a high current load (110) in an electronic device powered by a battery (112) comprises a voltage reference (104) for generating a reference voltage, and a drive current controller (102, 302) responsive to a drive control signal for selectively switching the drive current controller (102, 302) from an active state for supplying current to the high current load (110), to an inactive state for inhibiting the supply of current to the high current load (110). The drive current controller (102, 302) further controls the amount of current supplied to the high current load (110) when the battery (112) terminal voltage is substantially equal to the reference voltage. A load control element (108) is coupled to the drive current controller (102, 302) and drives the high current load (110) when the drive current controller (102, 302) is in the active state.

20 Claims, 6 Drawing Sheets

HIGH CURRENT DRIVER PROVIDING BATTERY OVERLOAD PROTECTION

FIELD OF THE INVENTION

This invention relates in general to high current drivers for driving high current loads utilized in battery powered electronic devices, and more particularly to an high current driver which provides battery overload protection.

DESCRIPTION OF THE PRIOR ART

Battery powered electronic devices, and in particular communication receivers, such a pagers, have utilized high current drivers to provide alerting circuits for driving audio transducers and vibrators to alert the user that a message has been received. Such alerting devices generally place a high load current on the battery when the alerting device is activated, and in a number of instances can result in the battery voltage drooping to a level where the communication receiver, or pager, will not operate. In addition, many battery powered communication receivers, such as pagers, have utilized display backlighting devices, such as lamps, to provide display backlighting when the ambient light level is low. The lamps also generally place a high load current on the battery when the lamp is activated, and in a number of instances can also result in the battery voltage drooping to a level where the communication receiver, or pager, will not operate.

One instance where such detrimental effect can occur is toward the end of life of the battery, during which time the internal cell impedance increases to a point such that the battery terminal voltage can droop dramatically when a high current load, such as an alerting device or display backlighting device, is activated. Another instance where such detrimental effect can occur is when a battery which hag intrinsically a high internal impedance, such as a zinc-air battery or a carbon zinc battery is utilized. Even though the battery is new, it may be only Within a very short period of time that the high current load of the alerting device or display backlighting device can result in failure of the communication receiver, or pager, to properly function; or when a low battery indicator function is provided within the communication receiver, to prematurely provide a low battery indication. Such a premature low battery indication more often than not leads to extreme user discontent.

In order to reduce the likelihood of such a premature low battery indication, or communication receiver malfunction, some prior art receivers have relied on a "load shedding" technique to extend the apparent battery life. In such a "load shedding" technique, as the battery terminal voltage deteriorates due to normal energy consumption, the various alerting functions are inhibited in an order related to their energy consumption. Thus, in a pager which provided audible, tactile and visual alert capability, the tactile alerting function would be inhibited first, followed by the visual alerting function, and finally by the audible alerting function. As the functionality of the pager was reduced, the user would know that it is time to replace the battery, while still being able to retain some level of message reception.

What is needed is an high current driver which can gradually reduce the power consumption of an alerting device or display backlighting device, thereby extending the relative life of the battery, which is particularly important when a high impedance battery is utilized in the battery powered electronic device, such as a communication receiver, or pager.

SUMMARY OF THE INVENTION

In accordance with a first embodiment of the present invention, a high current driver for driving a high current load in an electronic device powered by a battery having a terminal voltage which varies substantially in relation to a level of energy being consumed from the battery comprises a voltage reference, a differential amplifier and a load control element. The voltage reference generates a predetermined reference voltage. The differential amplifier has a bias control input which is responsive to a bias control signal for selectively switching the differential amplifier from an active state for providing a supply of current to the high current load, to an inactive state for inhibiting the supply of current to the high current load. The differential amplifier further has a first input coupled to the voltage reference and a second input coupled to the battery, wherein the differential amplifier senses a magnitude of the terminal voltage of the battery and in response thereto generates a drive control signal for controlling a magnitude of the current supplied to the high current load when the magnitude of the terminal voltage of the battery sensed is substantially equal to the predetermined reference voltage. The load control element is coupled to the differential amplifier and is responsive to the drive control signal for controlling the current supplied to the high current load when the differential amplifier is in the active state.

In accordance with a second embodiment of the present invention, a high current driver for driving a high current load in an electronic device powered by a battery having a terminal voltage which varies in relation to a level of energy consumption from the battery comprises a voltage reference and a drive current controller. The voltage reference generates a predetermined reference voltage. The drive current controller comprises a first switching element which has a first control input responsive to a drive control signal for selectively switching the first switching element from an active state for supplying current to the high current load to an inactive state for inhibiting the supply of current to the high current load, and a second switching element which is coupled to the first switching element and has a second control input which is responsive to the reference voltage signal for controlling a magnitude of the current supplied to the high current load by the first switching element when the magnitude of the terminal voltage of the battery is substantially equal to a predetermined threshold voltage.

In accordance with a first aspect of the present invention a communication receiver powered by a battery comprises a receiver, a decoder, a high current alerting device and a high current driver. The receiver receives and detects coded message signals including an address signal. The decoder is responsive to the detected address signal for generating an alert enable signal when the received address signal matches a predetermined address designating the communication receiver. The high current alerting device is used to generate a sensible alert. The high current driver comprises a voltage reference, a differential amplifier and a load control element. The high current driver comprises a voltage reference which generates a predetermined reference voltage, and a differential amplifier which has a bias control input which is responsive to a bias control signal for selectively switching the differential amplifier from an active state for providing a supply of current to the high current alerting device, and to an inactive state for inhibiting the supply of current to the high current alerting device. The differential amplifier further has a first input coupled to the voltage reference and a second input coupled to the battery, the differential amplifier senses a magnitude of the terminal voltage of the battery and in response thereto generates a drive control signal for controlling a magnitude of the current supplied to the high current alerting device when the magnitude of the terminal voltage of the battery sensed is substantially equal to the predetermined reference voltage. The load control element is coupled to the differential amplifier and is responsive to the drive control signal for controlling the current supplied to the high current alerting device when the differential amplifier is in the active state.

In accordance with a second aspect of the present invention a communication receiver powered by a battery comprises a receiver, a decoder, a high current alerting device and a high current driver. The receiver receives and detects coded message signals including an address signal. The decoder is responsive to the detected address signal for generating an alert enable signal when the received address signal matches a predetermined address designating the communication receiver. The high current alerting device is used to generated a sensible alert. The high current driver comprises a voltage reference and a drive current controller. The voltage reference generates a predetermined reference voltage. The drive current controller comprises a first switching element which has a first control input responsive to a drive control signal for selectively switching the first switching element from an active state for supplying current to the high current alerting device, and to an inactive state for inhibiting supplying current to the high current alerting device, and a second switching element which is coupled to the first switching element and has a second control input which is responsive to the reference voltage signal for controlling a magnitude of the current supplied to the high current alerting device by the first switching element when the magnitude of the terminal voltage of the battery is substantially equal to a predetermined threshold voltage.

DESCRIPTION OF THE PREFERRED EMBODIMENTS

Figure 1:
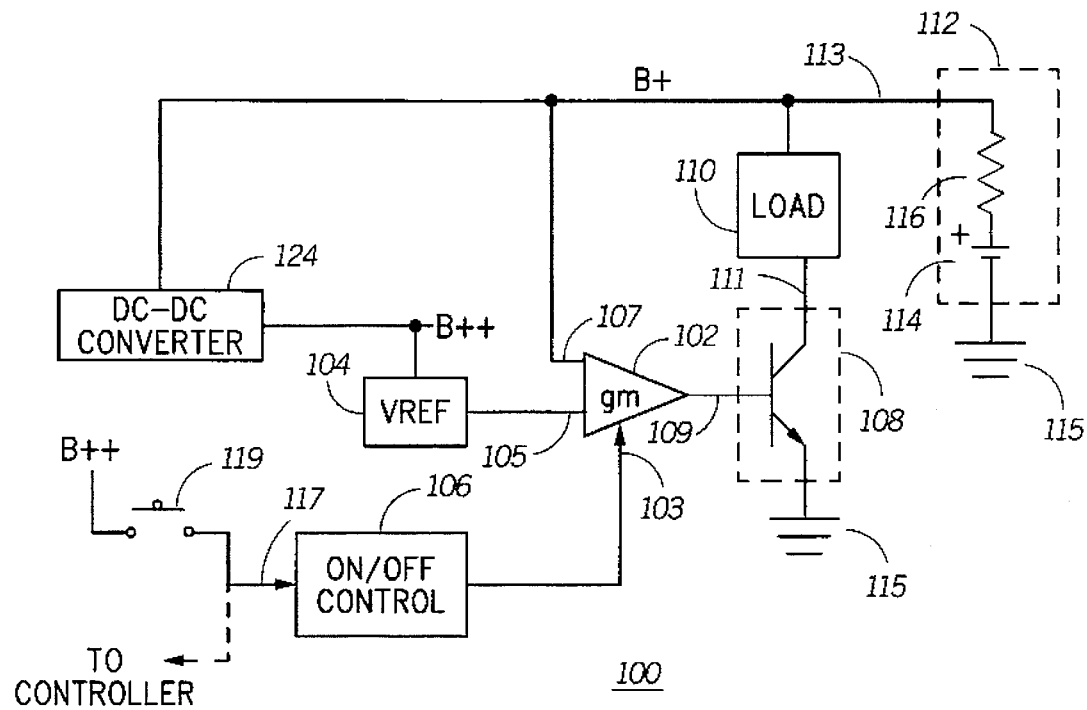
FIG. 1 is an electrical block diagram of a high current driver providing battery overload protection in accordance with a first embodiment of the present invention.

FIG. 1 is an electrical block diagram of a high current driver 100 providing battery overload protection in accordance with a first embodiment of the present invention. The output of a power control circuit 106 is coupled to a first, or bias control input 103 of a differential transconductance amplifier 102, hereinafter referred to as a differential amplifier 102. The power control circuit 106 controls the consumption of energy by the differential amplifier 102 during active (power on and current supplied) and inactive (power off) states. A voltage reference 104 is coupled to a second input 105 of the differential amplifier 102 and generates a predetermined reference voltage. The voltage reference 104 is preferably powered from a second supply voltage (B++) which is generated by a DC—DC converter 124 which is powered from the battery 112. The DC—DC converter typically generates a 3.1 volt output which is required to supply power to those circuits, such as a microcomputer, which requires a higher supply voltage. The output of the DC—DC converter is substantially regulated over the operational range of the battery 112 (from approximately 0.8 volt to 1.6 volts depending upon the particular battery type utilized) so as to provide a more stable voltage output for the voltage reference 104, which in turn improves the accuracy and stability of the predetermined reference voltage generated by the voltage reference 104.

A first, or positive battery terminal 113 of a battery 112 is coupled to a second input 107 of the differential amplifier 102. The differential amplifier 102 has an output 109 which delivers a drive control signal to an input of a load control element 108. The load control element 108 has two output terminals, a first output terminal 111 couples to a first terminal of a high current load 110, the other output terminal of the load control element 108 couples to a circuit ground 115. A second terminal of the high current load 110 also couples to the positive battery terminal 113 of the battery 112.

The battery 112 is shown depicted in FIG. 1 as an ideal battery 114 which has a first battery terminal (the negative battery terminal) which couples to the circuit ground 115. A second battery terminal (the positive battery terminal) couples to a first terminal of a resistor 116. The second terminal of the resistor 116 couples to the positive battery terminal 113. The ideal battery 114 and the resistor 116 depict schematically a general battery model such as is well known to one of ordinary skill in the art. The resistor 116 represents the internal cell impedance, the value (magnitude) of which typically varies over the life of a primary battery, such as an alkaline battery, increasing in value as the battery energy is depleted. The battery symbol represents an ideal battery 114, and the magnitude of the terminal voltage of the ideal battery decreases as energy is consumed. Batteries such as carbon-zinc batteries or zinc-air batteries, typically have relatively high internal cell impedance's, as compared to an alkaline battery, even for a new battery. As a result, such high impedance batteries are subject to substantial voltage droop when a low impedance, high current load is driven from the battery due to the voltage drop across the internal cell impedance.

The high current driver 100 shown in FIG. 1 operates to provide battery overload protection, and is especially useful with high internal impedance batteries, as described above. When an external drive request signal 117, such as provided by a switch 119 or a controller, is coupled to the input of the power control circuit 106 and the battery terminal voltage is substantially greater than the predetermined reference voltage, the differential amplifier 102 is selectively switched to an active state, supplying a predetermined current to the input of the load control element 108, which is shown as an NPN transistor, although it will be appreciated that the driving current polarity can be inverted such as through the use of a PNP transistor. The magnitude of the predetermined current supplied by the differential amplifier 102 is controlled, among other things, by the output limiting characteristics of the differential amplifier 102. The NPN transistor in turn saturates, supplying current to the high current load 110, the magnitude of the current supplied being dependent upon the resistance of the high current load and the battery terminal voltage. When the external drive request signal 117 is suspended, the differential amplifier 102 is switched to an inactive state, inhibiting the supply of the predetermined current to the input of the load control element 108, which in turn switches the NPN transistor off and inhibits the supply of current to the high current load 110.

As the battery terminal voltage droops to the point where the magnitude of the battery terminal voltage approaches the predetermined reference voltage established by the voltage reference 104, such as when the battery is nearly depleted, or when a high internal resistance battery is utilized, the differential amplifier 102 will no longer supply the predetermined current which insures that the NPN transistor is saturated, but rather the magnitude of the current supplied to the input to the load control element 108 is proportionally reduced, being dependent upon the magnitude of the battery terminal voltage relative to the predetermined reference voltage. The NPN transistor is no longer supplied sufficient current to remain saturated and moves into the linear region of operation, and as a consequence, the current being drawn by the high current load 110 is reduced. With less current being drawn by the high current load 110, the voltage droop which would otherwise occur using a conventional saturated switch driver is reduced, avoiding the aforementioned problems which would otherwise occur in an electronic device, such as a laptop computer or a communication receiver. The differential amplifier 102 thus operates to sense the magnitude of the battery terminal voltage relative to the predetermined reference voltage, and as long as the magnitude of the battery terminal voltage is substantially greater, typically 50 millivolts or more above the predetermined reference voltage, the NPN transistor is saturated. When the magnitude of the battery terminal voltage becomes substantially equal to the predetermined reference voltage, typically over a voltage input range of 50 millivolts above and below the predetermined threshold voltage, the NPN transistor operates in the linear region, gradually reducing the magnitude of the current being drawn from the battery, and as a result reducing the voltage droop that would occur as compared to the battery voltage when operating the high current load 110 at the maximum current. It will be appreciated, that when the magnitude of the battery voltage drops to substantially less than the predetermined threshold voltage, the output current of the high current driver 100 would be substantially zero, thereby fully inhibiting the supply of current to the high current load 110. The high current driver 100 is therefor able to maintain the magnitude of the battery terminal voltage within the input voltage range over which proportional control of the current delivered to the high current load is possible.

Figure 2:
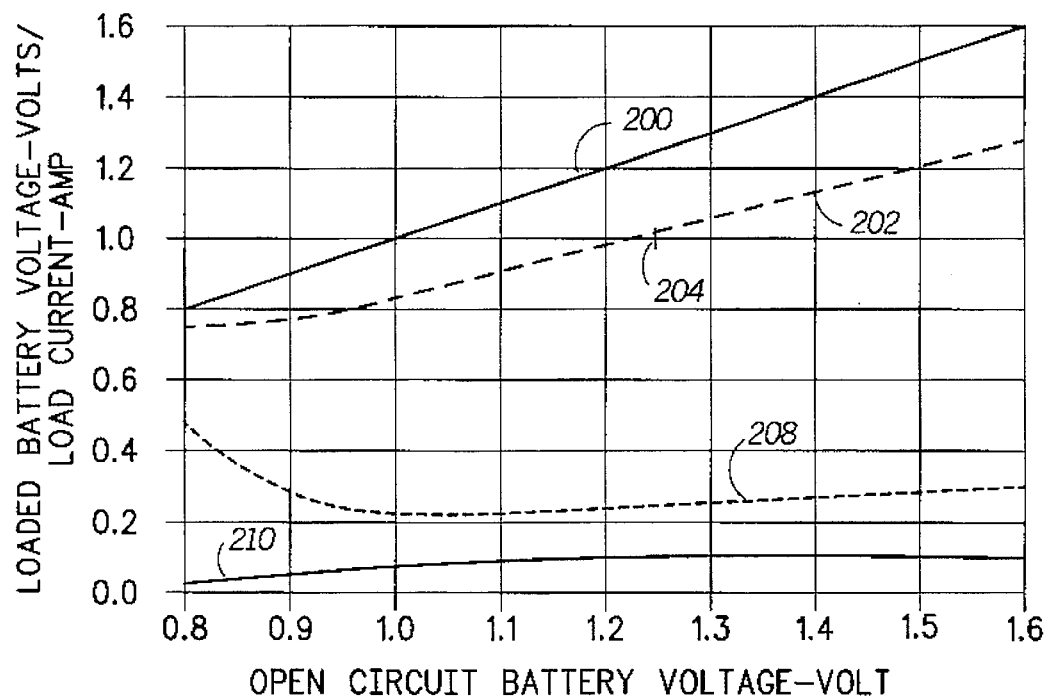
FIG. 2 is a graph depicting the operation of prior art high current drivers.
Figure 3:
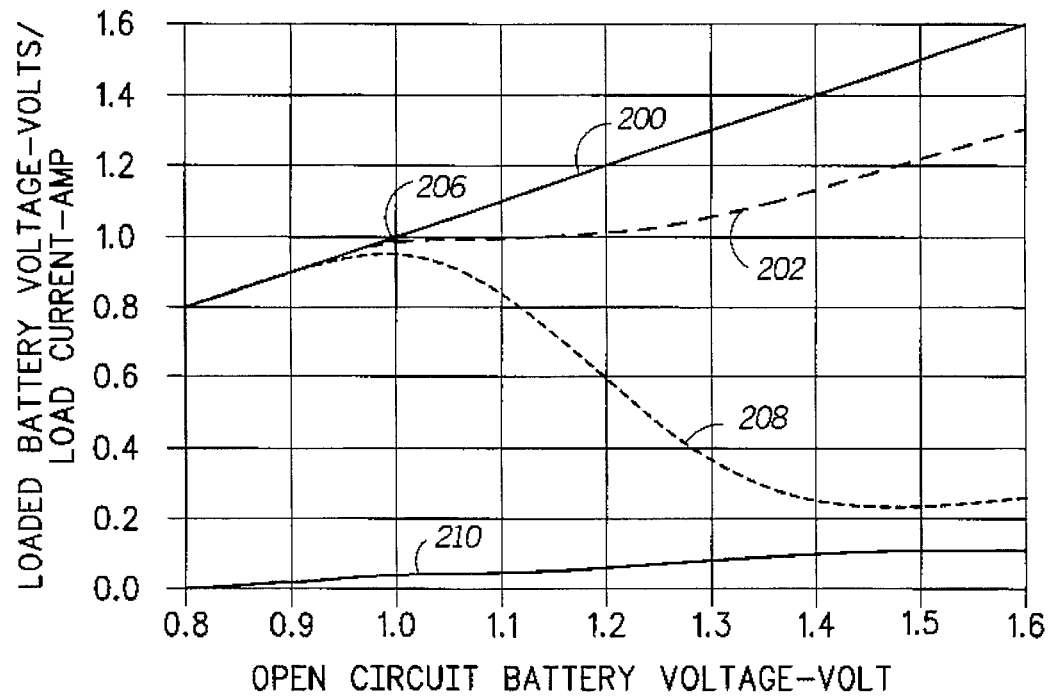
FIG. 3 is a graph depicting the operation of high current driver providing battery overload protection in accordance with the present invention.

FIG. 2 is a graph which depicts the operation of a prior art audio transducer driver utilized in a battery operated communication receiver which typically draws by example 100 milli-Amperes (mA) of current from a single cell battery. FIG. 3 is a graph which depicts the operation of the high current driver 100 in accordance with the present invention which is operated as by example as an audio transducer driver which typically draws 100 milli-Amperes (mA) of current from a single Cell battery. Referring to FIGS. 2 and 3, the open circuit battery voltage is plotted on the horizontal axis and the loaded battery terminal voltage is plotted on the vertical axis. The curve 200 illustrates that when the battery 112 is only lightly loaded, the loaded battery terminal voltage tracks substantially the open circuit battery voltage. The second curve 202 illustrates that for a 100 mA load current, the actual loaded battery terminal voltage is substantially lower than the open circuit battery voltage. In an electronic device, such as a communication receiver which operates from a single cell battery, reliable operation is typically achieved when the loaded battery terminal voltage remains above 1.0 volt. In the prior art audio transducer driver circuit, as shown in FIG. 2, this condition exists only for Open circuit battery voltages above 1.25 volts (204). As shown in FIG. 3, the open circuit battery voltage can drop to approximately 1.0 volt (206) before the magnitude of the loaded battery terminal voltage drops below 1 volt.

The third curve 208 in FIG. 2 illustrates that the load control element 108 transistor collector voltage remains in saturation down to a loaded battery terminal voltage of 0.8 volts, and then the collector voltage gradually increases as the transistor is operated out of the saturation region. As a consequence, as shown by the fourth curve 210 of FIG. 2, the load current remains substantially constant while the transistor is saturated, and then drops off markedly as the collector voltage increases. As shown by the third curve 208 in FIG. 3, the transistor which forms the load control element 108 remains substantially in saturation as long as the loaded battery terminal voltage remains above about 1.10 volts, and then the collector voltage continues to increase in response to the drop in the loaded battery terminal voltage. As a consequence, as shown By the fourth curve 210 of FIG. 3, the load currently gradually drops to 0.0 mA as the loaded battery terminal voltage approaches 1.0 volt. It will be appreciated from FIGS. 2 and 3, and the explanation provided above, that the effective battery life is extended by the high current driver 100 which provides battery overload protection in accordance with the first embodiment of the present invention.

It will be appreciated that the high current driver 100 described above can be utilized in many applications where battery overload protection would be beneficial for extending the operational life of a battery. One such application is in a communication receiver, as was described above and will be described in further detail below, where the high current load 110 can be an audible alerting device, such as an electromagnetic transducer, for generating an audible alerting signal; a tactile alerting device, such as a vibrator, for generating a tactile alerting signal; or a visual alerting device, such as an incandescent lamp or LED, for generating a visual alerting signal. When the high current driver 100 is utilized in a communication receiver, the external drive request signal is generated from within the communication receiver, as will be described below. The high current driver 100, can also be utilized to drive a backlighting device, such as an incandescent lamp or other relatively high current illumination device, to provide illumination to a display when the communication device is used in a dark area and a message is displayed. When the high current driver 100 is used to drive the backlighting device, the external drive request signal is generally provided by a switch 119 (shown in FIG. 1), although it will be appreciated that the external drive request signal can also be generated automatically when the ambient light level sensed is low and a message is being displayed.

Figure 4:
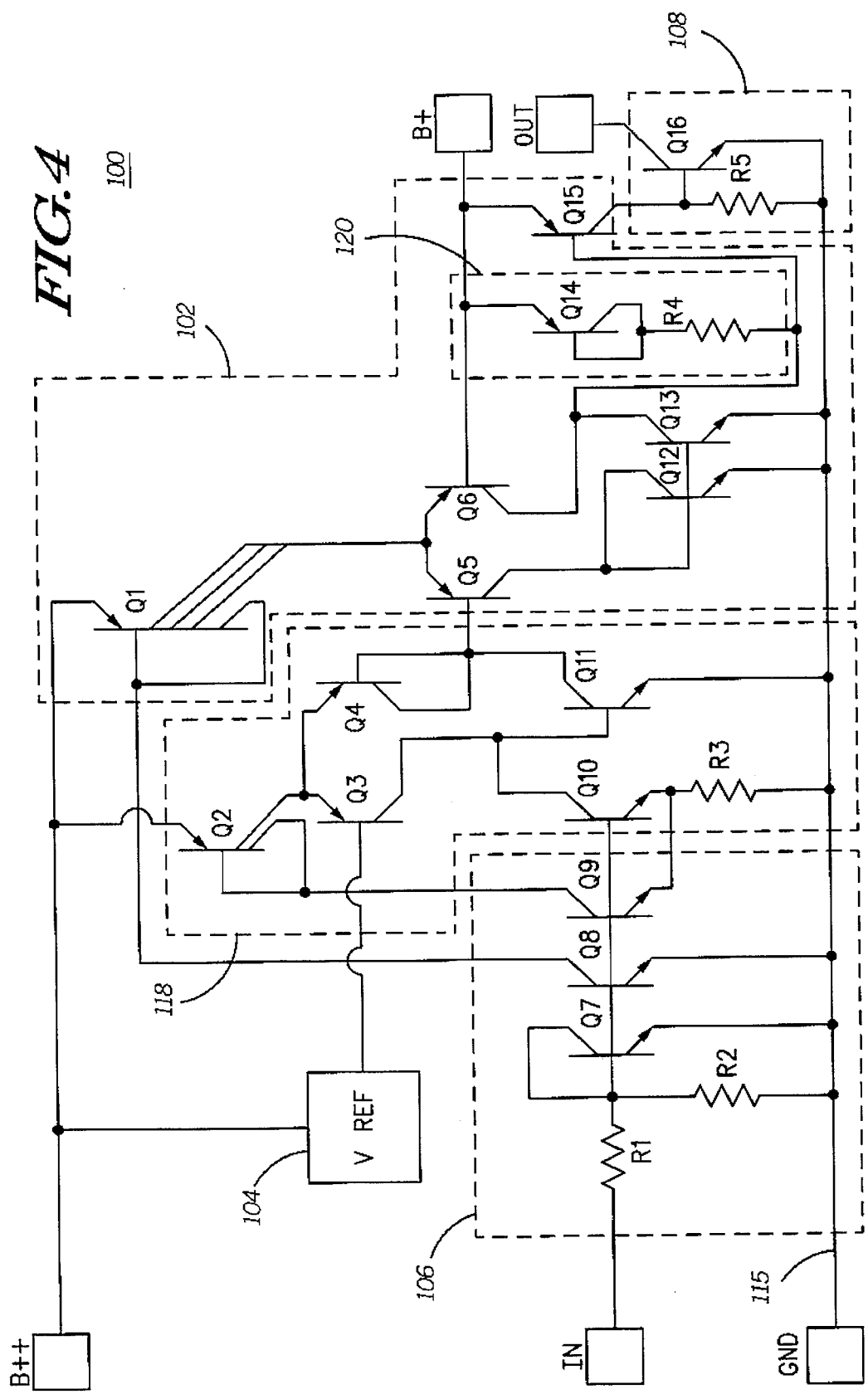
FIG. 4 is an electrical schematic diagram of the high current driver of FIG. 1.

FIG. 4 is an electrical schematic diagram of the high current driver of FIG. 1. The high current driver 100 includes a differential amplifier 102 which includes a PNP transistor Q1 which has an emitter coupled to a B++supply voltage and four split collectors, One of the split collectors of transistor Q1 ties back to the base, and the remaining three split collectors are coupled together and connect to the emitters of PNP transistors Q5 and Q6. The collector of transistor Q5 is connected to the base of NPN transistor Q12 which also connects to the base of NPN transistor Q13. The collector of transistor Q6 is coupled to the collector of transistor Q13 and also to the base of PNP transistor Q15. The emitters of transistor Q12 and 13 are connected together to ground potential. The emitter of transistor Q15 couples to the battery voltage (B+), which also couples to the base of transistor Q6. The collector of transistor Q12 is tied back to the base of transistor Q6. Transistors Q12 and Q13 form a current mirror, wherein the current sourced by the collector of transistor Q5 is mirrored in the collector of transistor Q13. The collector of transistor Q15 connects to the input of the load control element 108, and in particular to the base of NPN transistor Q16. The emitter of transistor Q16 connects to the ground potential, and the collector of transistor Q16 provides the output for the load control element 108, which as previously described connects to the high current load 110. Transistors Q15 and Q16 form an amplifier for sinking the load current to the high current load 110. A resistor R5 connects to the base of transistor Q16 and to the circuit ground 115. The emitter of a diode connected PNP transistor Q14 connects to the battery voltage (B+), and the collector and base of the diode connected transistor Q14 connects to one terminal of resistor R4. The other terminal of resistor R4 connects to the base of transistor Q15 and to the collectors of transistors Q6 and Q13. Transistor Q14 and resistor R4 form a leakage control element 120 and together with resistor R5 serve to minimize the effects of amplifier leakage current when the high current driver 100 is switched off.

Unlike that shown in FIG. 1, where the output of the voltage reference 104 couples to the first input of differential amplified 102, the output of the voltage reference 104, as shown in FIG. 4 connects to an input of a buffer amplifier 118 having unity gain. The buffer amplifier 118 includes PNP transistors Q3 and Q4 which have emitters connected together and to the collector of a split-collector PNP transistor Q2. The emitter of transistor Q2 connects to a second supply voltage (B++). The second supply voltage (B++) is for example typically 3.1 volts and is normally supplied by a step-up DC—DC converter (not shown) which is powered from the battery 112. The DC—DC converter output is substantially regulated over the operational range of the battery 112 (from approximately 0.8 volt to 1.6 volts depending upon the particular battery type utilized) so as to provide a stable voltage to the voltage reference 104, which in turn improves the accuracy and stability of the predetermined reference voltage generated by the voltage reference 104. The second collector of transistor Q2 connects to the base of transistor Q2 and to the collector of NPN transistor Q9. The collector of transistor Q3 connects to the collector of NPN transistor Q10 and to the base of NPN transistor Q11. The collector of transistor Q4 connects to the base of transistor Q4, to the collector of transistor Q11 and to the base of transistor Q5 which is the first input to the differential amplifier 102. The emitter of transistor Q10 connectors to the emitter of transistor Q9 and to one terminal of a resistor R3. The second terminal of resistor R3 connects to the ground potential. The emitter of transistor Q11 also connectors to a ground potential furnished by the circuit ground 115.

The base of transistor Q10 connects to the base of transistor Q9, the base of transistor Q8, the base of transistor Q7 and to one terminal of resistor R1 and to one terminal of resistor R2. The second terminal of resistor R1 provides the input to the power control circuit 106 which includes transistors Q7, Q8, and Q9. The second terminal of resistor R2 connects to the ground potential. The emitters of transistors Q7 and Q8 are connected to the ground potential. The collector of transistor Q7 connects back to the base of transistor Q7. The collector of transistor Q8 connects to the base of transistor Q1. The collector of transistor Q9 connects to the base and one collector of transistor Q2.

When a high, i.e. coupled to the second supply voltage (B++), external drive request signal is coupled to the input of power control circuit 106 a current is established in transistor Q7 which is mirrored in transistors Q8, Q9 and Q10. The current sunk by transistor Q8 turns on transistor Q1 activating the differential amplifier 102. The current sunk in transistor Q9 turns on transistor Q2 activating the buffer amplifier 118. The buffer amplifier 118 isolates the output of the voltage reference 104 from the first input of the differential amplifier 102, and it will be appreciated that the buffer amplifier 118 may not always be needed depending upon the output impedance of the voltage reference 104. The supply voltage (B+) connects to the second input of differential amplifier 102. When the supply voltage (B+) is substantially higher than the reference voltage, transistor Q6 is reverse biased. Consequently, when the external drive request signal is supplied to the power control circuit 106, the output current generated by the differential amplifier has a maximum predetermined magnitude, resulting in transistor Q16 being turned on in a saturated condition, supplying a maximum current to the high current load 110 depending upon the load resistance and the supply voltage (B+).

Figure 5:
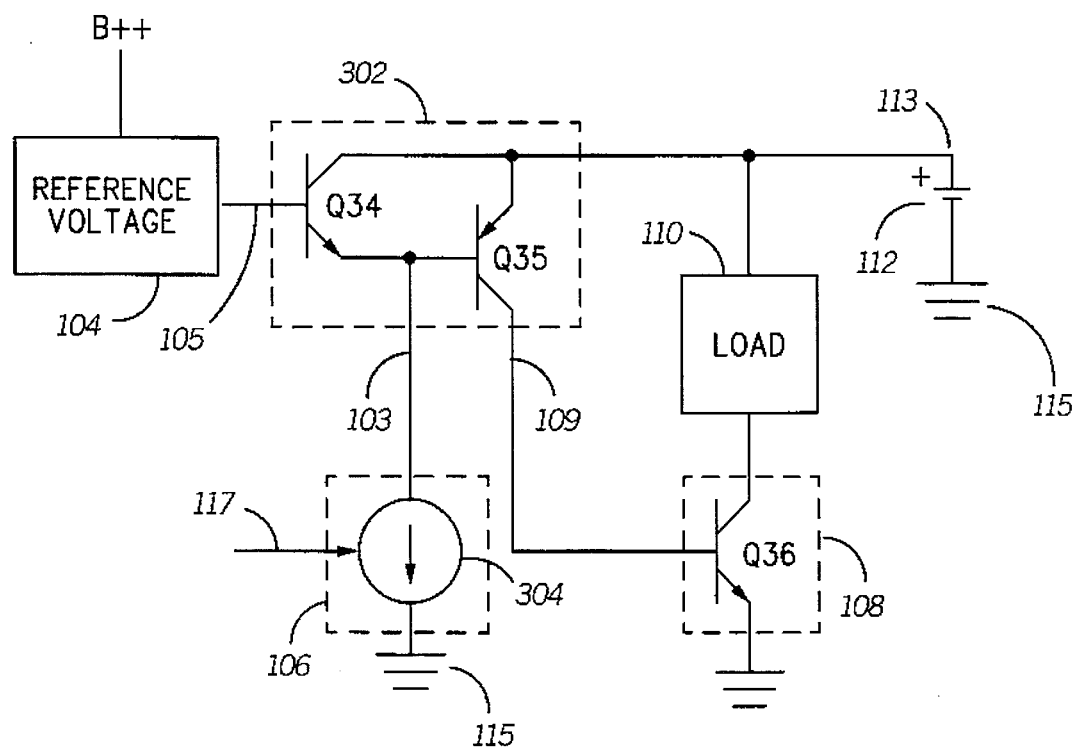
FIG. 5 is an electrical schematic diagram of a high current driver providing battery overload protection in accordance with a second embodiment of the present invention.

During operation of the high current driver 100, battery voltage (B+) is compared with the buffered reference voltage by the differential amplifier 102. When the load current from the battery 112 attempts to pull the magnitude of the battery terminal voltage below the reference voltage, transistor Q6 becomes forward biased, and a portion of the current that was being delivered to the base of transistor Q15 is absorbed by transistor Q6, thereby reducing the drive current to transistor Q16, which in turn will eventually pull transistor Q16 out of saturation. When transistor Q16 is pulled out of saturation, the voltage developed across the high current load 110 is reduced, thereby reducing the current which is pulled from the battery 112. As the internal cell impedance of the battery increases as the battery becomes more depleted of energy, the voltage developed across the high current load will be continuously reduced, as described above, thereby reducing the energy consumption of the high current load 110, and effectively extending the life of the battery for use by other circuits within the battery powered communication receiver. Under normal operating conditions, the feedback arrangement provided by the differential amplifier 102 will work to prevent the magnitude of the battery terminal voltage from being drawn below the predetermined threshold voltage established by the voltage reference 104. It will be appreciated that once the battery becomes sufficiently depleted by circuits other than the high current driver 100 circuit in the electronic device, the magnitude of the battery terminal voltage will eventually be drawn below the predetermined threshold voltage established by the voltage reference 104. A compensation capacitor (not shown) may be required in the differential amplified 102 to ensure stability when the battery terminal voltage approaches the reference voltage. A suitable location for this capacitor, when needed, would be between the base of transistor Q15 and the circuit ground 115. FIG. 5 is a simplified electrical schematic diagram of a high current driver 500 providing battery overload protection in accordance with a second embodiment of the present invention. As shown in FIG. 5, a external drive request signal 117 couples to the input of power control circuit 106 which is shown as a switched current source 304. One terminal of the switched current source 304 is coupled to the circuit ground 115, and the output of the switched current source 304 couples to a first, or bias control input 103 of a drive current controller 302. A second input 105 of the drive current controller 302 couples to the output of a voltage reference 104 which is connected preferably to a second supply voltage (B++), as described above, and which generates a predetermined reference voltage. A third input to the drive current controller 302 couples to the positive terminal 113 of a battery 112. The output 109 of the drive current controller 302 couples to the input of a load control element 108, which as shown is an NPN transistor. A first output of the load control element couples to a first terminal of the high current load 110 while a second output couples to the circuit ground 115. The second terminal of the high current load 110 is coupled to the positive terminal 113 of the battery 112.

The drive current controller 302 comprises an NPN transistor Q34 and a PNP transistor Q35. The collector of transistor Q34 couples to the emitter of transistor Q35 and forms the third input of the drive current controller 302 described above and couples to the positive terminal 113 of the battery 112. The emitter of transistor Q34 couples to the base of transistor Q35 and forms the first input of the drive current controller 302 described above and is coupled to the output of the switched current source 304. The base of transistor Q34 forms the second input of the drive current controller 302 described above and is coupled to the voltage reference 104. The collector of transistor Q35 forms the output of the drive current controller 302 described above and couples to the input of the load control element 108.

During normal operation $$V_{REF} - VBE_{Q34} > V_{B+} - VBE_{Q35}$$

where $V_{REF}$ is the predetermined reference voltage.

$VBE_{Q34}$ is the forward biased base to emitter voltage drop of Q34.

$V_{B+}$ is the battery 112 terminal voltage.

$VBE_{Q35}$ is the forward biased base to emitter voltage drop of Q35.

The threshold voltage $V_{TH}$, at which the high current driver 500 controls the high current load 110 is then given by:

$$V_{TH} = V_{REF} - VBE_{Q34} + VBE_{Q35}$$

Assuming $VBE_{Q34}$ is substantially the same as $VBE_{Q35}$, as long as the loaded battery terminal voltage is substantially greater than the predetermined threshold voltage $V_{TH}$, the base-emitter junction of transistor Q34 is reverse biased, and when an external drive request signal 117 is coupled to the input of the switched current source 304, the switched current source 304 provides the base current to turn on transistor Q35. When turned on, transistor Q35 provides full drive current to the load control element 108, which in turn provides power to the high current load 110. As the loaded battery terminal voltage approaches the predetermined threshold voltage $V_{TH}$, transistor Q34 becomes forward biased, and a portion of the base current previously provided to transistor Q35 is converted to emitter current in transistor Q34, thereby reducing transistor Q35 drive to the load control element 108, and as a result reducing the current provided to the high current load 110, as illustrated in FIG. 3. It will be appreciated that as the loaded battery terminal voltage droops further, significantly more current will be converted to emitter current in transistor Q34, further reducing the base drive provided to transistor Q35, and subsequently further reducing the current provided to the high current load as shown in FIG. 3. A significant advantage of the high current driver 500 over the high current driver illustrated in FIG. 4 is the improved circuit stability due to having only two active devices in the feedback loop, making the need for a compensation capacitor unlikely.

While the high current driver 500 shown in FIG. 5 utilizes the load control element 108 to drive the high current load 110, it will be appreciated that the drive current controller 302 can, in certain circumstances, directly drive the high current load 110 from the collector of transistor Q35. One such circumstance would be where transistor Q35 is a discrete transistor, and transistor Q35 is capable of supplying directly the drive current to the high current load 110. In this instance, the terminal of the high current load 110 shown coupled to the battery 112 would instead be coupled to the circuit ground 115. Likewise it will be appreciated that when the voltage reference 104, the drive current controller 302 and the switched current source 306 are integrated, the load control element 108 can be provided by a discrete NPN transistor Q36.

Figure 6:
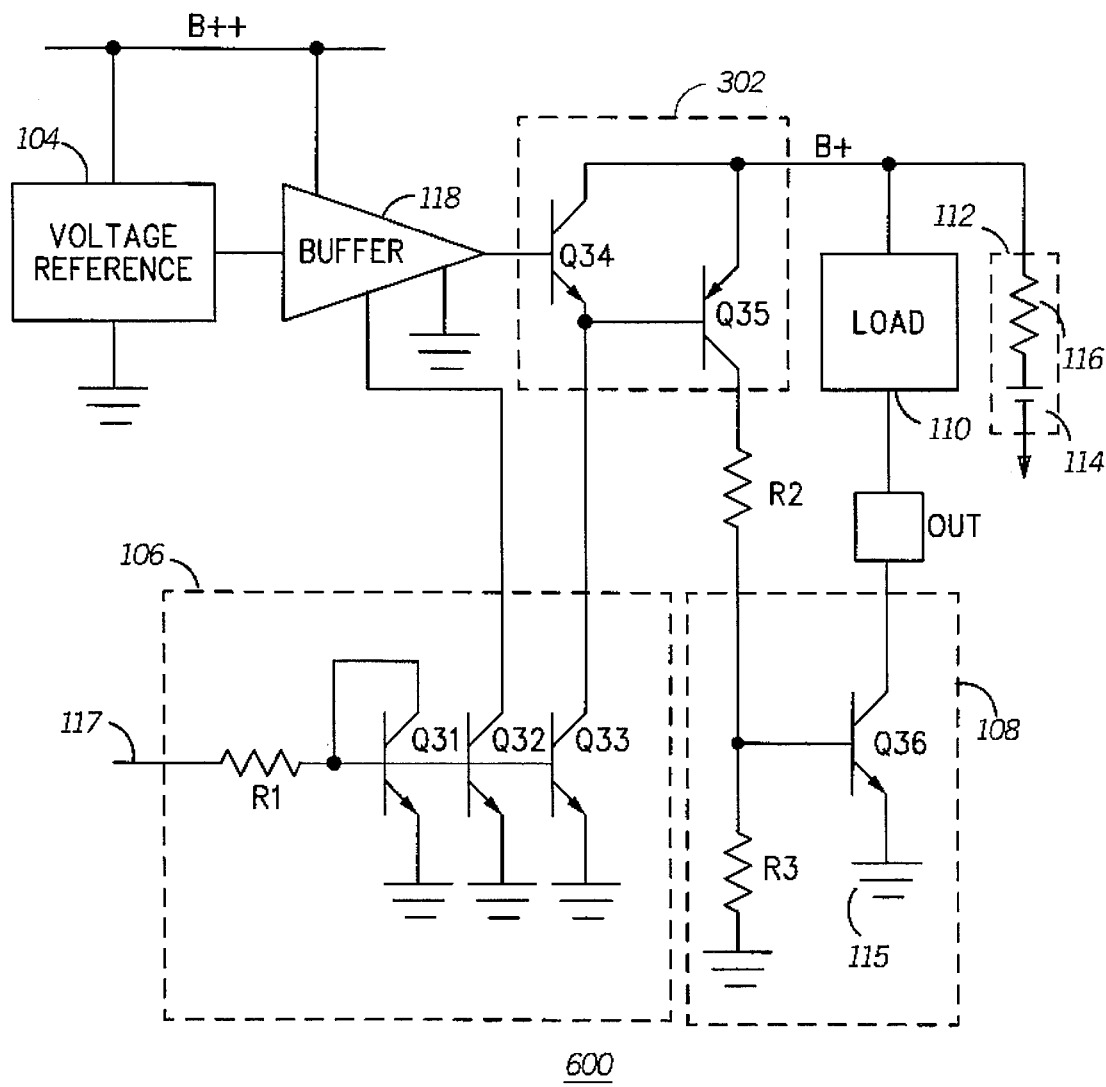
FIG. 6 is an expanded electrical schematic diagram of a high current driver of FIG. 5.

FIG. 6 is an electrical schematic diagram of the high current driver 600 providing battery overload protection in accordance with the second embodiment of the present invention. Only those elements which differ from that shown and described for the high current driver 500 of FIG. 5 will be described in detail below. Unlike that shown in FIG. 5, the output of the voltage reference 104 couples to the input of a buffer amplifier 118, which isolates the voltage reference 104 from the input to the drive current controller 302, thereby further insuring the accuracy and stability of the reference voltage.

The switched current source 106 includes a resistor R1 which at one terminal receives the external drive request signal 117. The other terminal connects to the base terminal of an NPN transistor Q31. The collector of transistor Q31 is connected back to the base of transistor Q31 and the emitter is connected to the circuit ground 115. The base of transistor Q31 also couples to the bases of NPN transistors Q32 and Q33. The emitters of transistor Q32 and Q33 are connected to the circuit ground 115. The collector of transistor Q32 couples to a bias control input of the buffer amplifier 118 and provides an enable signal to enable and disable operation of the buffer amplifier 118. The collector of transistor Q33 couples to the emitter of transistor Q34 and the base of transistor Q35. Transistors Q32 and Q33 operate as current mirrors mirroring the current flowing through the diode connected transistor Q31. When the input to transistor Q31 is low, i.e. coupled to the circuit ground 115, there is no current flowing through transistor Q31, and consequently there is no current mirrored by transistors Q32 and Q33 thereby disabling the buffer amplifier 118 and the drive current controller 302. When the input to transistor Q31 is high, i.e. coupled to the second supply voltage (B++), the current flowing through transistor Q31 is mirrored by transistors Q32 and Q33 thereby enabling the buffer amplifier 118 and the drive current controller 302. As a result, when the external drive request signal is low, no current is delivered to the high current load and no energy is consumed from the battery 112 by the buffer amplifier 118 or drive current controller 302, which in turn further aids in extending the life of the battery.

As shown, in FIG. 6, the load control element 108 comprises an NPN transistor Q36. One terminal of a resistor R3 connects to the base of transistor Q36 while the other terminal of resistor R3 connects to the circuit ground 115. The output of the drive current controller 302 is connected to one terminal of a resistor R2, the other terminal of resistor R2 is connected to the base of transistor Q36. Resistor R3 sinks any collector base leakage current, thereby preventing transistor Q36 from turning on when the high current driver 600 is turned off. Resistor R2 limits the magnitude of the base current provided to transistor Q36 in a manner well known to one of ordinary skill in the art.

Figure 7:
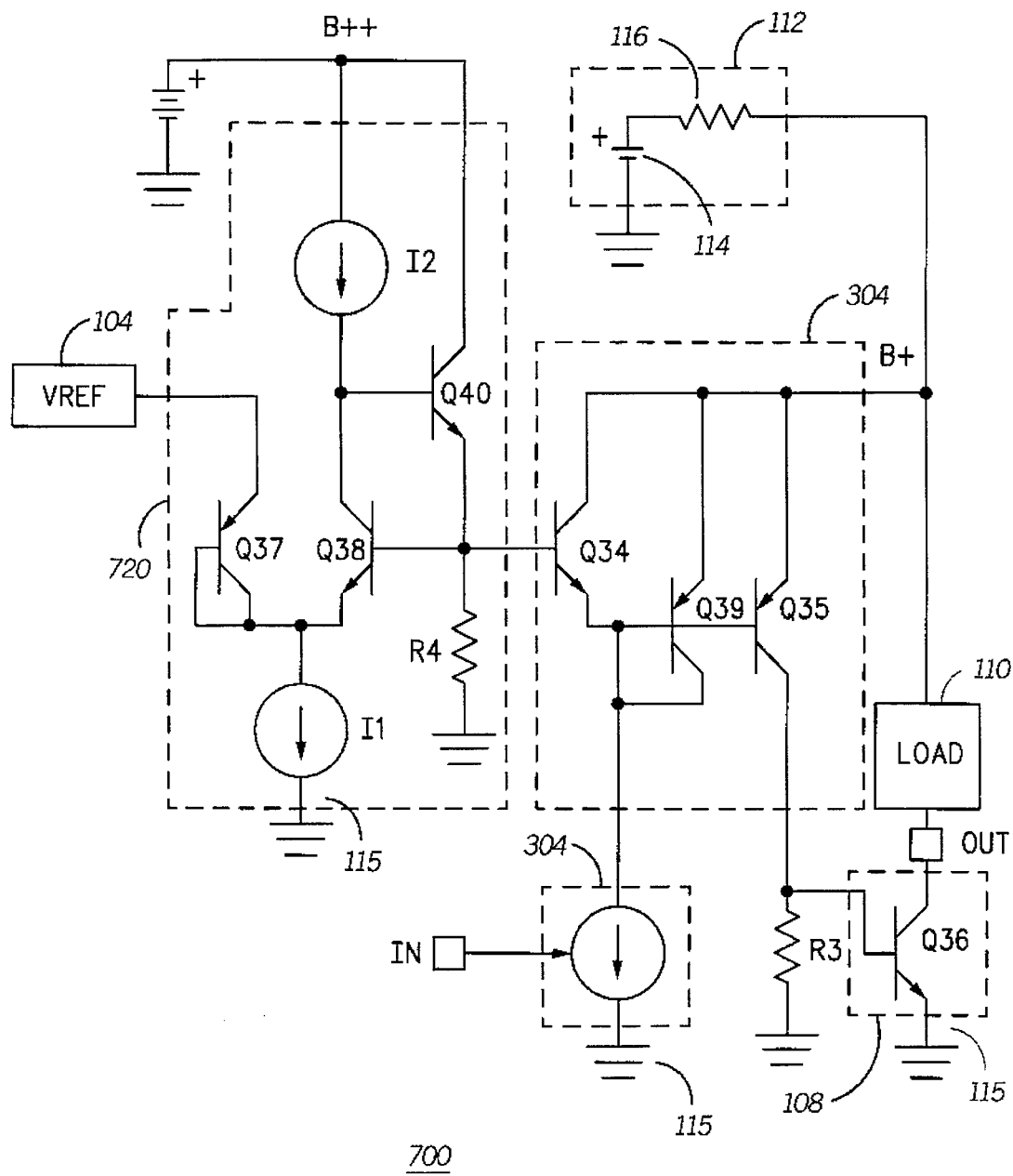
FIG. 7 is an electrical schematic diagram of a high current driver providing battery overload protection in accordance with a third embodiment of the present invention.

FIG. 7 is an electrical schematic diagram of the high current driver 700 providing battery overload protection in accordance with the third embodiment of the present invention. Referring briefly back to FIG. 5, it was noted that when $VBE_{Q34}$ is substantially the same as $VBE_{Q35}$, then $V_{TH}=V_{REF}$.

It will be appreciated that since transistors Q34 and Q35 are of opposite types, $VBE_{Q34}$ only approximates $VBE_{Q35}$, and the magnitude of the base-emitter junction voltage drops will vary with temperature and device processing. Consequently, the threshold voltage, $V_{TH}$, at which the high current driver 500 controls the high current load 110 load current is not stable, but will vary. The high current driver 700 shown in FIG. 7 largely overcomes this deficiency as will be described below. Unlike the high current driver 500 or the high current driver 600, the high current driver 700 includes a compensation circuit 720 which couples between the voltage reference 104 and the second input to the drive current controller 302. The compensation amplifier comprises a PNP transistor Q37, NPN transistors Q38 and Q40 and two current sources I1 and I2. The emitter of transistor Q37 couples to the output of the voltage reference 104. The collector of transistor Q37 connects to the base of transistor Q37, to the emitter of transistor Q38 and to one terminal of current source I1. The second terminal of current reference I1 connects to the circuit ground 115. The collector of transistor Q38 couples to the base of transistor Q40 and to one terminal of current source I2. The second terminal of current source I2 couples to the second supply voltage (B++). The base of transistor Q38 couples to the emitter of transistor Q40, to the base of transistor Q34 which is the input to the drive current controller 302 as described above, and to one terminal of a resistor R4. The second terminal of resistor R4 connects to the circuit ground 115. The collector of transistor Q40 is coupled to the second supply voltage (B++).

In the preferred embodiment of the compensation circuit 720, the current source I1 has a magnitude twice that of the current reference I2. A small portion of the current from current source I2 is coupled into the base of transistor Q40 which in turn supplies base current for transistor Q38, transistor Q34 and current through R4. That portion of the current supplied by current source I2 which is not coupled into the base of transistor Q40 flows into the collector of transistor Q38. Since the resultant emitter current of transistor Q38 is approximately one-half of the current that can be sunk by current source I1, the remainder of the I1 current is coupled to the collector of diode-connected transistor Q37 which is then coupled through the emitter of transistor Q37 into the voltage reference 104. Since the magnitude of the current source I1 is twice that of the current source I2, the current flowing through the base-emitter junctions of transistors Q37 and Q38 will be approximately equal. With the compensation circuit 720 added, the threshold voltage, $V_{TH}$, in FIG. 7 is given by:

$$V_{TH}=V_{REF}-VBE_{Q34}+VBE_{Q35}+VBE_{Q38}-VBE_{Q37}$$

where $V_{REF}$ is the predetermined reference voltage.

$VBE_{Q34}$ is the forward biased base to emitter voltage drop of Q34.

$VBE_{Q35}$ is the forward biased base to emitter voltage drop of Q35.

$VBE_{Q37}$ is the forward biased base to emitter voltage drop of Q37.

$VBE_{Q38}$ is the forward biased base to emitter voltage drop of Q38.

When processed in an integrated circuit, the base-emitter voltages of PNP transistors Q35 and Q37 will track over process variations and temperature as will the base emitter voltages of NPN transistors Q34 and Q38. Assuming that, at the threshold voltage $V_{TH}$, the ratio of the emitter currents in transistors Q37 and Q38 are equal to the ratio of the emitter currents in transistors Q35 and Q34, then the differences in the NPN and PNP transistor base-emitter voltages will cancel, and the threshold voltage, $V_{TH}$, will be approximately equal to $V_{REF}$.

Also unlike the drive current controller 302 of FIGS. 5 and 6, the drive current controller 302 of FIG. 7 comprises a second PNP transistor Q39. The base of transistor Q39 connects to the emitter of transistor Q34, the base of transistor Q35, the collector of transistor Q39 and to the output of the switched current source 304. The emitter of transistor Q39 connects to the emitter of transistor Q35. Transistor Q39 in combination with transistor Q35 forms a current mirror. Preferably, the emitter area of transistor Q35 is selected to be larger than the emitter area of transistor Q39 so that the emitter current of transistor Q35 is much larger than the emitter current of transistor Q39. A typical emitter area ratio between Q35 and Q39 would be eight.

When the switched current source 304 is switched on, current flows through diode-connected transistor Q39 which in turn establishes the current flowing from the collector of transistor Q35. Since the emitter current of transistor Q35 is derived from a current mirror, this further insures that the ratio of the emitter currents in transistors Q35 and Q34, at the threshold voltage, $V_{TH}$, is equal to the ratio of the emitter currents in transistors Q37 and Q38, further insuring the stability of the reference voltage over temperature. The operation of the high current driver 700, otherwise is as previously described.

Figure 8:
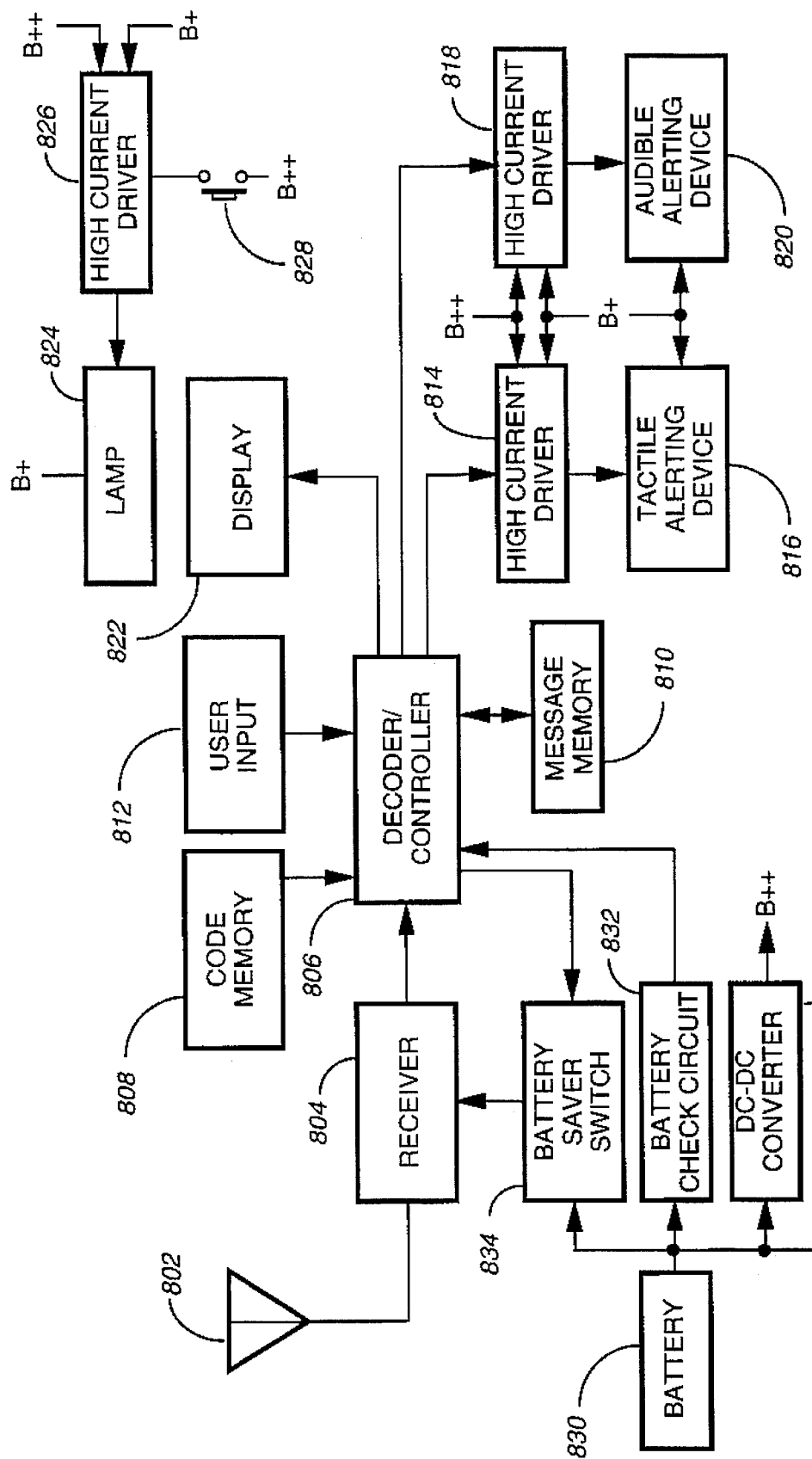
FIG. 8 is an electrical block diagram of a communication device utilizing the high current driver providing battery overload protection in accordance with the present invention.

FIG. 8 is an electrical block diagram of a communication receiver 800 utilizing the high current driver 100, 500, 600 or 700 in accordance with the present invention. In operation a transmitted selective call message, which typically includes an address and a message corresponding thereto, is intercepted by an antenna 802 and is coupled into the input of a receiver 804 which receives and detects the selective call message in a manner well known to one of ordinary skill in the art, providing at the output of the receiver 804 a stream of data corresponding to the detected selective call message. The stream of data is coupled to the input of a decoder/controller 806 which processes the data including the selective call message, and when the address received in the selective call message matches an address assigned to the communication receiver 800 which is stored in a code memory 808, the message portion of the selective call message is stored in a message memory 810 for recall at a later time. An alert output signal is generated by the decoder/ controller 806 which can be directed to a high current driver 814, such as described above, which would drive a high current tactile alerting device 816, alerting silently the user that a message has been received and stored. The alert output signal can also be directed to a high current driver 818, such as described above, which would drive a high current audible alerting device 820, alerting audibly the user that a message has been received and stored. The alert output is reset either automatically after a time-out, or by the user using user controls 812. The message stored in the message memory 810 is recalled using the user controls 812, whereupon the message is displayed on a display 822, such as an LCD display. When the ambient light level is low, the communication receiver user actuates a switch 828 which couples to the input of a high current driver 826, such as described above, which in turn supplies power to a lamp 824, thereby providing illumination for reading the message on the display 822. It will be appreciated that the decoder/controller 806 when coupled with a photo-detector (not illustrated), can automatically provide illumination to the display 822 by switching on the high current driver 826.

Power is supplied to the receiver 804 from a battery 830 via a battery saver switch 834. Operation of the battery saver switch 834 is controlled by the decoder/controller 806 in a manner well known to one of ordinary skill in the art so as to extend the normal life of the battery 830. By utilizing the high current driver 814, 818 and 826 which provides battery overload protection in accordance with the present invention, the life of the battery 830 can be further extended, as described above. The high current driver 814, 818 and 826 also enable the communication receiver 800 to operate effectively, although with shorter battery life, with batteries having high internal impedance, as described above. A battery check circuit 832 is coupled to the battery and monitors the battery terminal voltage. When the battery terminal voltage drops to a predetermined battery check level, a low battery warning signal is generated which is coupled to the decoder/controller 806, which in turn generates a low battery alert signal which is coupled either to the high current driver 814 which would drive a high current tactile alerting device 816, alerting silently that the battery 830 needs replacement, or to a high current driver 818 which would drive a high current audible alerting device 820, alerting audibly the user that the battery 830 needs replacement. When the high current driver 814, 818 and 826 providing battery overload protection are utilized in combination with a battery check circuit, the communication receiver user is provided with additional time during which a replacement battery must be obtained, before the receiver 804 becomes completely non-operative. While the high current driver circuit 100, 500 and 600 have been described above as being coupled to a voltage reference 104, it will be appreciated that when multiple high current driver circuits, such as high current driver 814, 818 and 826 are integrated onto a common semiconductor die, only a single voltage reference is required for the multiple high current driver circuits.

As previously described above, a DC—DC converter 124 is provided which supplies power to those circuit which require a higher supply voltage, and which is also coupled to the high current driver 814, 818 and 826, to provide a voltage source isolated from the battery voltage, as described above.

In summary, what has been described above is a high current driver which provides battery overload protection. The high current driver described above monitors the loaded battery terminal voltage, and when the loaded battery terminal voltage falls to a predetermined voltage threshold, the drive current supplied to a high current device, such as an alerting device, or a display illumination device, gradually is reduced. By gradually reducing the drive current to the high current devices, the observed performance of the high current devices is only gradually degraded over time, while the battery life is effectively extended.

When the high current driver in accordance with the present invention is utilized in a battery powered electronic device, such as a laptop computer, a communication receiver, or other electronic device which includes high current load devices as described above, the extension of battery life obtained by providing battery overload protection enables the user to reliably carry out calculations or to receive messages for a greater period of time before the battery must be replaced. The high current driver in accordance with the present invention also enables the use of batteries having high internal impedance, albeit for shorter periods of time than that obtained from a high quality battery.

We claim:

1. A high current driver for driving a high current load in an electronic device powered by a battery having a terminal voltage which varies substantially in relation to a level of energy being consumed from the battery, said high current driver comprising:

a voltage reference generating a predetermined reference voltage;

a differential amplifier, having a bias control input, responsive to a bias control signal, for selectively switching said differential amplifier from an active state for providing a supply of current to the high current load, to an inactive state for inhibiting the supply of current to the high current load, said differential amplifier further having a first input, coupled to said voltage reference, and a second input coupled to the battery, said differential amplifier sensing a magnitude of the terminal voltage of the battery during the active state, and in response thereto, generating a drive control signal for proportionally reducing the current supplied to the high current load when the magnitude of the terminal voltage of the battery sensed is substantially equal to a predetermined voltage level; and a load control element, coupled to said differential amplifier, and responsive to the drive control signal for supplying current to the high current load when the differential amplifier is in the active state and the magnitude of the battery terminal voltage is greater than the predetermined voltage level, and further for proportionally reducing the supply of current to the high current load when the differential amplifier is in the active state and the magnitude of the battery terminal voltage is substantially equal to the predetermined voltage level.

2. The high current driver of claim 1, wherein, in the active state when the magnitude of the terminal voltage of the battery sensed is substantially equal to a predetermined voltage level, the drive control signal generated by said differential amplifier maintains the magnitude of the battery terminal voltage within the input voltage range over which proportional control of the current delivered to the high current load occurs.

3. The high current driver of claim 1, wherein, in the active state, the magnitude of the drive control signal generated by said differential amplifier is substantially zero when the magnitude of the terminal voltage of the battery sensed is substantially lower than the predetermined voltage level.

4. The high current driver of claim 1, further comprising a power control circuit coupled to said bias control input for generating the bias control signal in response to an external drive request signal.

5. The high current driver of claim 4, wherein the external drive request signal is generated manually using a switch.

6. The high current driver of claim 4, wherein said power control circuit enables said differential amplifier to consume current from the battery in the active state, and wherein said power control circuit inhibits said differential amplifier to consume current from the battery in the inactive state.

7. A high current driver for driving a high current load in an electronic device powered by a battery having a terminal voltage which varies in relation to a level of energy consumption from the battery, said high current driver comprising:
 a voltage reference for generating a predetermined reference voltage; and
 a drive current controller comprising
  a first switching element, having a first control input responsive to a drive control signal, for selectively switching said first switching element from an active state for supplying current to the high current load, to an inactive state for inhibiting supplying current to the high current load, and
  a second switching element coupled to said first switching element and having a second control input responsive to the predetermined reference voltage, for proportionally reducing the current supplied to the high current load by said first switching element during the active state when the magnitude of the terminal voltage of the battery is substantially equal to a predetermined voltage level.

8. The high current driver of claim 7, further comprising a load control element, coupled to said first switching element, for driving the high current load when the first switching element is in the active state.

9. The high current driver of claim 7, wherein said first switching element comprises a PNP transistor.

10. The high current driver of claim 9, wherein said second switching element comprises a NPN transistor.

11. The high current driver of claim 7, wherein said first switching element comprises a current mirror.

12. The high current driver of claim 7, wherein said first switching element comprises an NPN transistor and said second switching element comprises a PNP transistor, and wherein the magnitude of the terminal voltage of the battery at which said second switching element controls the magnitude of the current supplied to the high current load by said first switching element is a function of matching between said PNP transistor and said NPN transistor, and wherein said high current driver further comprises a compensation circuit coupled to said voltage reference and to said second control input for compensating for matching between said PNP transistor and said NPN transistor.

13. The high current driver of claim 7, wherein, in the active state when the magnitude of the terminal voltage of the battery sensed is substantially equal to a predetermined voltage level, the drive control signal generated by said drive current controller maintains the magnitude of the battery terminal voltage within the input voltage range over which proportional control of the current delivered to the high current load occurs.

14. The high current driver of claim 7, wherein, in the active state, the magnitude of the drive control signal generated by said drive current controller is substantially zero when the magnitude of the terminal voltage of the battery sensed is substantially lower than the predetermined voltage level.

15. The high current driver of claim 7, further comprising a power control circuit coupled to said first control input for generating the drive control signal in response to an external drive request signal.

16. The high current driver of claim 15, wherein the external drive request signal is generated manually using a switch.

17. The high current driver of claim 15, wherein said power control circuit enables said drive current controller to consume current from the battery in the active state, and wherein said power control circuit inhibits said drive current controller to consume current from the battery in the inactive state.

18. A communication receiver powered by a battery having a terminal voltage which varies in relation to a level of energy consumption from the battery, comprising:
 a receiver for receiving and detecting coded message signals including an address signal;
 a decoder, responsive to the address signal received, for generating an alert enable signal when the address signal received matches a predetermined address designating the communication receiver;
 a high current alerting device for generating a sensible alert;
 a high current driver, comprising
  a voltage reference generating a predetermined reference voltage, and
  a differential amplifier, having a bias control input, responsive to the alert enable signal, for selectively switching said differential amplifier from an active state for providing a supply of current to said high current alerting device, to an inactive state for inhibiting the supply of current to said high current alerting device,
 said differential amplifier further having a first input, coupled to said voltage reference, and a second input coupled to the battery, said differential amplifier sensing a magnitude of the terminal voltage of the battery during the active state, and in response thereto, generating a drive control signal for proportionally reducing the current supplied to a high current alerting device when the magnitude of the terminal voltage of the battery sensed is substantially equal to a predetermined voltage level; and
 a load control element, coupled to said differential amplifier, and responsive to the drive control signal for supplying current to the high current load when the differential amplifier is in the active state and the magnitude of the battery terminal voltage is greater than the predetermined voltage level, and further for proportionally reducing the supply of current supplied to the high current load when the differential amplifier is in the active state and the magnitude of the battery terminal voltage is substantially equal to the predetermined voltage level.

19. A communication receiver powered by a battery having a terminal voltage which varies in relation to a level of energy consumption from the battery, comprising:
 a receiver for receiving and detecting coded message signals including an address signal;
 a decoder, responsive to the address signal received, for generating an alert enable signal when the address signal received matches a predetermined address designating the communication receiver;

a high current alerting device for generating a sensible alert; and a high current driver, comprising
- a voltage reference generating a predetermined reference voltage, and
- a drive current controller comprising
  - a first switching element, having a first control input responsive to alert enable signal, for selectively switching said first switching element from an active state for supplying current to said high current alerting device, to an inactive state for inhibiting supplying current to said high current alerting device, and
  - a second switching element coupled to said first switching element and having a second control input responsive to the predetermined reference voltage, for proportionally reducing the current supplied to said high current alerting device by said first switching element during the active state when the magnitude of the terminal voltage of the battery is substantially equal to the predetermined voltage level.

20. The communication receiver according to claim 19, wherein said high current driver further comprises a load control element, coupled to said first switching element, for driving said high current alerting device when the first switching element is in the active state.

* * * * *